United States Patent [19]

Tagiri

[11] Patent Number: 5,083,080
[45] Date of Patent: Jan. 21, 1992

[54] HIGH FREQUENCY SIGNAL MEASURING EQUIPMENT WITH CABLED DETECTING AND SIGNAL COMPANDING

[75] Inventor: Osamu Tagiri, Atsugi, Japan

[73] Assignee: Anritsu Corporation, Tokyo, Japan

[21] Appl. No.: 544,119

[22] Filed: Jun. 26, 1990

[30] Foreign Application Priority Data

Jun. 30, 1989 [JP] Japan .................................. 1-169377

[51] Int. Cl.⁵ ...................... G01R 21/04; G01R 19/24; G01R 19/18
[52] U.S. Cl. .................................. 324/118; 324/115; 324/616; 324/611
[58] Field of Search .......................... 381/106; 455/72; 333/14; 324/611, 118, 77 R, 77 A, 95, 98, 123 R, 132, 115, 134, 616

[56] References Cited

U.S. PATENT DOCUMENTS

| | | | |
|---|---|---|---|
| 3,041,535 | 6/1962 | Cochran | 324/118 |
| 3,213,391 | 10/1965 | Kovalevski | 381/106 |
| 3,969,680 | 7/1976 | Wermuth | 381/106 |
| 4,123,711 | 10/1978 | Chow | 381/106 |
| 4,341,994 | 7/1982 | Kawasaki | 324/118 |
| 4,628,256 | 12/1986 | Powell | 324/118 |
| 4,647,845 | 3/1987 | Richter | 324/77 C |

FOREIGN PATENT DOCUMENTS 2178259  2/1987  United Kingdom ................ 381/106

OTHER PUBLICATIONS

Oliver: "Electronic Measurements and Instrumentation", McGraw Hill-1972-p. 599.

Primary Examiner—Kenneth A. Wieder
Assistant Examiner—Jose M. Solis
Attorney, Agent, or Firm—Frishauf, Holtz, Goodman & Woodward

[57] ABSTRACT

A signal detector includes a signal input section, a detector, and a converter. The signal input section inputs a high frequency signal to be measured. The detector detects the high frequency signal to be measured input by the signal input section. The converter amplifies the output from the detector and includes a variable gain preamplifier which has a first gain higher than a linear gain when the detecting output is smaller than a predetermined value and a second gain lower than the linear gain when the detecting output is larger than the predetermined value. A cable line transmits an output from the variable gain preamplifier of the converter of the signal detector. A measuring equipment body includes a decoder and an analyzer. The decoder amplifies an output from the variable gain preamplifier transmitted by the cable line and includes a variable gain main amplifier which has a first gain lower than a linear gain when an output from the variable gain preamplifier is smaller than a predetermined value and a second gain higher than a linear gain when the output from the variable gain preamplifier is larger than the predetermined value. The analyzer performs predetermined signal analysis for an output amplified by the variable gain main amplifier of the decoder.

9 Claims, 10 Drawing Sheets

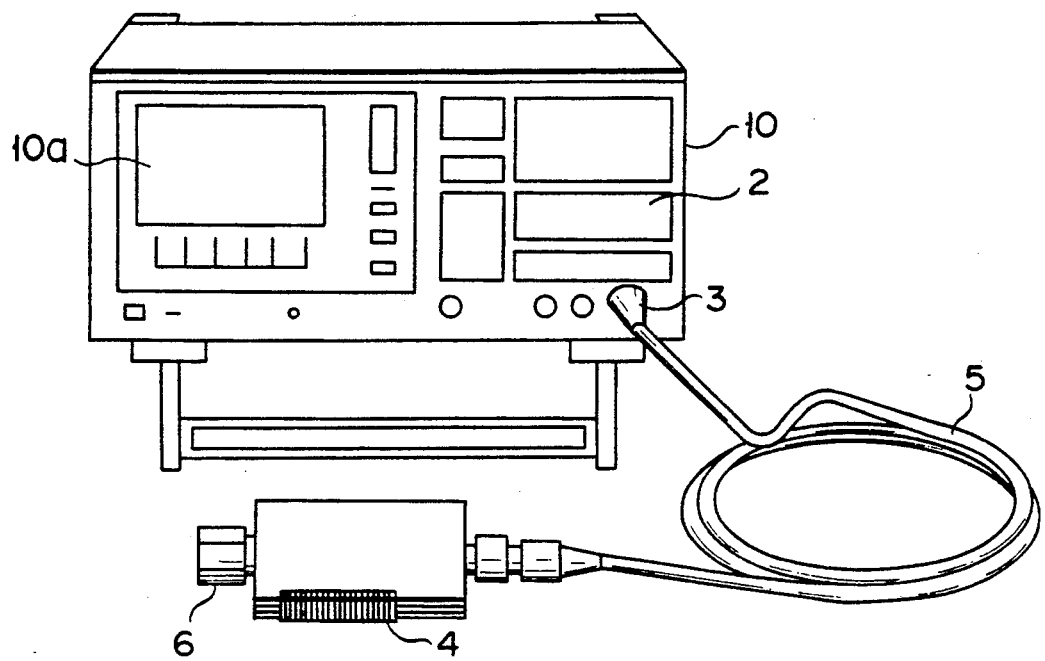
F I G. 4
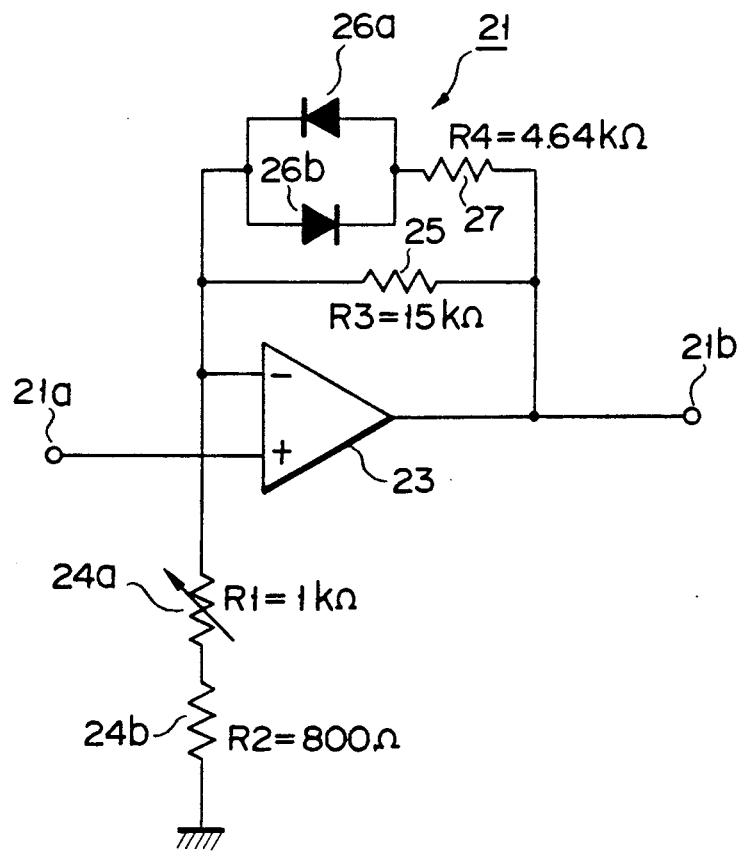
F I G. 5

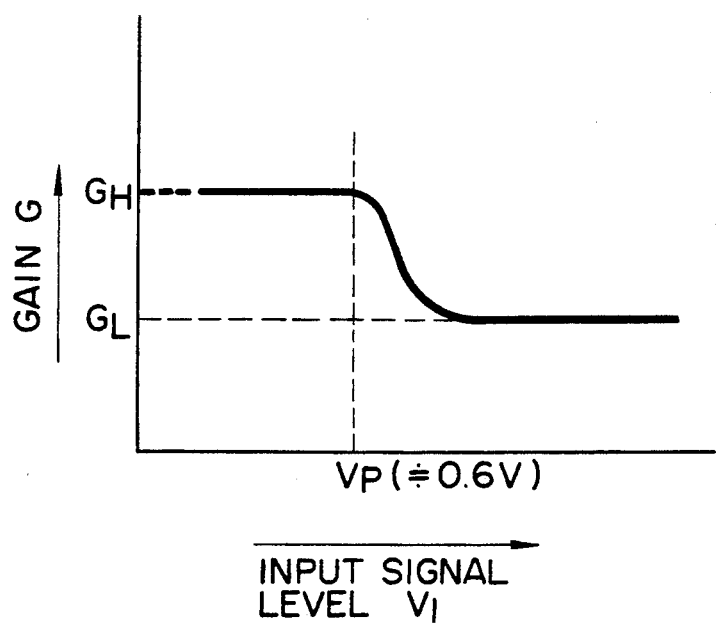
F I G. 6
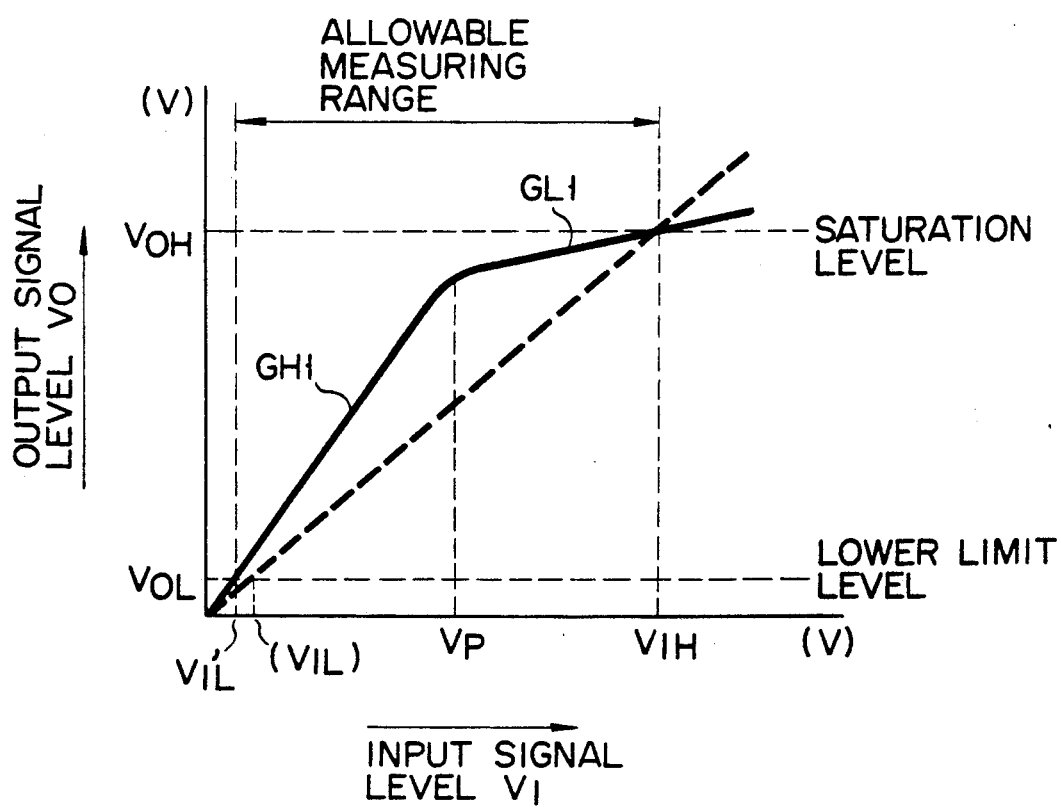
F I G. 7

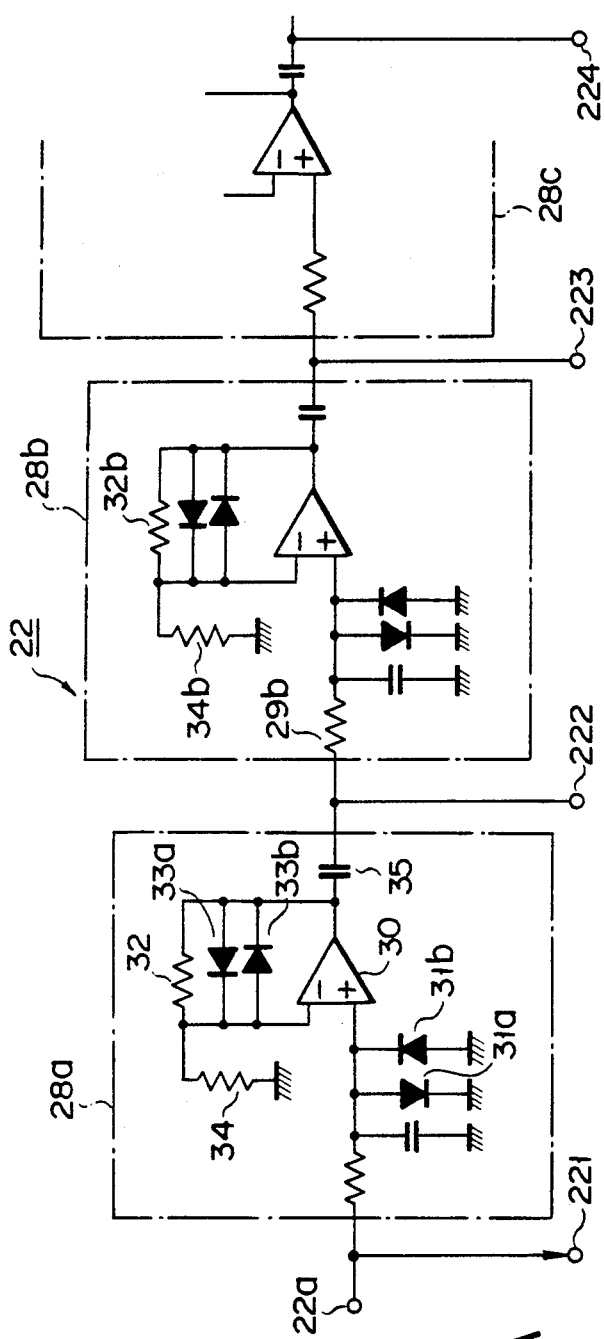
F I G. 8A
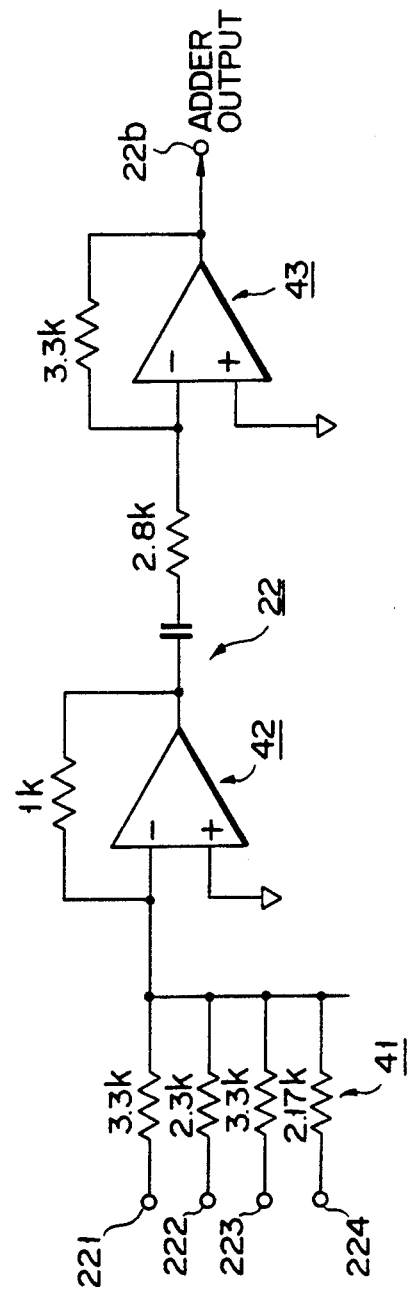
F I G. 8B

HIGH FREQUENCY SIGNAL MEASURING EQUIPMENT WITH CABLED DETECTING AND SIGNAL COMPANDING

BACKGROUND OF THE INVENTION

1. Field of the Invention

The present invention generally relates to a high frequency signal measuring equipment and, more particularly, to a high frequency signal measuring equipment having a cabled detector.

2. Description of the Related Art

A high-frequency signal measuring apparatus detector having a cabled detector, such as a network analyzer or a level measuring device, generally has the following unique problems. That is, since a cabled detector is naturally, easily affected by signal attenuation or external noise, a dynamic range is limited and the measuring result has a large amount of errors.

For this reason, a high-precision measuring technique applied to a scalar network analyzer for measuring a value of transmission or impedance of a circuit (circuit element) as a function of the frequency of an input signal is disclosed in U.S. Pat. No. 4,647,845. According to this technique, a cabled detector is arranged as an AC/DC detector used by switching two detector modes, i.e., a DC detector mode for a continuous wave input signal and an AC detector mode for a high-frequency pulse input signal. An output from the AC/DC detector is added to an AC network analyzer as a test signal through a cable line.

That is, according to the scalar network analyzer, on only an AC/DC detector side serving as a cabled detector, measuring error mixing caused by the signal attenuation or the external noise is prevented to realize high-precision measurement, and the scalar network analyzer has an arrangement shown in FIG. 1.

An AC/DC detector 18 includes an RF detector 40 that is connected to a chopper 44. The RF detector 40 detects an RF signal 28 supplied on a line 16 and transforms it into a rectified signal supplied on a line 42. The magnitude of the rectified signal supplied on the line 42 is proportional to the amplitude of the RF signal 28.

In the DC detection mode, the chopper 44 modulates the rectified signal supplied on the line 42 to produce a modulated signal supplied on a line 46. In the AC detection mode, the chopper 44 simply supplies the modulated signal, unaltered, on the line 42. In the AC detection mode, the chopper 44 does not modulate the rectified signal because when a pulsed RF signal is rectified, that rectified signal is already a modulated signal.

The modulated signal supplied on the line 46 is amplified by a preamplifier 48 to produce an amplified signal supplied on a line 50. In the DC detection mode, this amplified signal supplied on the line 50 is sampled by a sampler 52 to produce a sampled signal, supplied on a line 54. Sampling is done to eliminate any feed generated by the chopper 44. In the AC detection mode, no sampling is needed since no chipping has taken place. Here, the sampler 52 simply supplies the amplified signal on the line 54 as the sampled signal.

A buffer-compensator 56 buffers the sampled signal supplied on the line 54 and removes from the sampled signal supplied on the line 54 an unwanted signal due to a parasitic capacitance of the sampler 52. This produces modulated signal 30 supplied on a line 20.

An oscillator and timing logic 58 controls both the chopper 44 and the sampler 52. The chopper 44 is controlled by a first control signal supplied on a line 60 and a second control signal supplied on a line 62. The sampler 52 is controlled by a third control signal supplied on a line 64. As described in greater detail later, the first control signal and the second control signal open and close the chopper 44. The third control signal opens and closes the sampler 52.

The oscillator and timing logic 58 is controlled by a mode selector 59. The mode selector 59 establishes in which the mode AC/DC detector 18 will be set. While set in the AC detection mode, the timing and oscillator logic 58 provides the first and second control signals to the chopper 44 and the third control signal to the sampler 52 such that no chopping or sampling is done. While set in the DC detection mode, the timing and oscillator logic 58 provides the chopper 44 with the first and second control signals which open and close the chopper 44 at a frequency of 27.77 kHz, and the sampler 52 with the third control signal which opens and closes the sampler at a frequency of 55.55 kHz. Both modes supply the modulated signal 30 on the cable line 20.

In the above arrangement, since a preamplifier having a sufficiently small DC drift is used as the preamplifier 48, the circuit arrangement of the preamplifier is complicated and expensive. Therefore, the chopper 44 is provided to convert a DC signal into a pulse signal having a predetermined frequency and to suppress an influence of current level variation in the preamplifier 48.

The signal to be measured converted into a pulse signal input to an AC detecting network analyzer (measuring equipment body) 1 is amplified by a main amplifier 11 again, detected by a detector 12, and converted into a DC signal again. The signal to be measured converted into the DC signal is input to an analyzer 14 through a low-pass filter 13. The analyzer 14 performs predetermined analysis for the DC signal to be measured which is input, and the result is displayed on, e.g., a display screen of an operation panel (not shown).

As described above, since the signal to be measured input from the signal detecting terminal or connector 6 is detected and amplified by an AC/DC detector 18 and transmitted to the measuring equipment body 1 through the cable line 20, a decrease in S/N ratio due to attenuation of the signal to be measured or noise in the cable line 20 can be prevented compared with a case wherein the signal to be measured is input from the signal detecting terminal or connector 6 through the cable line 20 to the measuring equipment body 1.

In the above description, the preamplifier 48 is a simple linear amplifier, and a log amplifier is used as the main amplifier 11 to perform a dB display.

However, even in the scalar network analyzer shown in FIG. 1, the following problems are posed.

One of amplitude characteristics required by an amplifier incorporated in a measuring equipment is a linear amplitude characteristic in which a gain is constant independently of a signal level of an input signal. FIG. 2 is graph showing a relationship between an input signal level $V_I$ and an output signal level $V_O$ of the preamplifier 48 installed in the AC/DC detector 18. However, in the preamplifier 48 having the linear amplitude characteristics, a dynamic range is limited so that an excessive signal is input to saturate an output signal. A signal level of the input signal corresponding to a saturation level $V_{OH}$ of the output signal is a maximum input value $V_{IH}$.

When the output signal level $V_O$ is excessively low, since an amplified signal to be measured is transmitted through the cable line 20 constituted by a cable line having a length of 1 to 2 m, external noise is mixed in the signal to be measured, thereby decreasing an S/N ratio when the signal is input to the measuring equipment body 1. Therefore, a minimum input value $V_{IL}$ is a signal level of an input signal corresponding to a lower limit level $V_{OL}$ which can assure an S/N ratio having a predetermined value or more.

Thus, since an allowable range of the input signal level $V_I$ to the preamplifier 48 is limited within the range of $V_{IL}$ to $V_{IH}$ an allowable measuring range of the signal to be measured of the whole scalar network analyzer is limited within the range of $V_{IL}$ to $V_{IH}$.

When a signal to be measured has a signal level lower than the input minimum value $V_{IL}$ or when a signal to be measured has a signal level higher than the input maximum value $V_{IH}$, measuring precision of the whole measuring equipment may be degraded.

SUMMARY OF THE INVENTION

It is, therefore, an object of the present invention to provide a new and improved high frequency signal measuring equipment with cabled detecting and signal companding in which as a variable gain preamplifier having first and second gains representing amplification factors which are decreased according to an increase in input signal level arranged on a cabled detector side, a small input signal can be amplified to have a large magnitude, a large input signal can be amplified to have a small magnitude, and an allowable range of an input signal level to the preamplifier can be largely widened, and as a variable gain main amplifier having first and second gains representing amplification factors of which are increased according to an increase in an input signal level is arranged on a measuring equipment body side, an allowable measuring range of the signal to be measured of the whole measuring equipment can be largely widened, thereby widening a measuring dynamic range and improving measuring precision.

According to one aspect of the present invention, there is provided a high frequency signal measuring apparatus comprising:

a signal detector comprising:

(a) signal inputting means for inputting a high frequency signal to be measured;

(b) detecting means for detecting the high frequency signal to be measured input by the signal inputting means; and (c) converting means for amplifying a detecting output from the detecting means and including a variable gain preamplifier having a first gain higher than a linear gain when the detecting output is smaller than a predetermined value and a second gain lower than the linear gain when the detecting output is larger than the predetermined value;

a cable line for transmitting an output from the variable gain preamplifier in the converting means of the signal detector; and a measuring equipment body comprising:

(a) decoding means for amplifying an output from the variable gain preamplifier transmitted by the cable line and including a variable gain main amplifier having a first gain lower than a linear gain when an output from the variable gain preamplifier is smaller than a predetermined value and a second gain higher than the linear gain when the output from the variable gain preamplifier is larger than the predetermined value; and (b) analyzing means for performing predetermined signal analysis for an output amplified by the variable gain main amplifier of the decoding means.

According to a high frequency signal measuring equipment with the above arrangement, the variable gain preamplifier incorporated in the signal detector has an amplitude characteristic in which a gain is decreased according to an increase in input signal level. Therefore, when a signal to be measured input from a signal detecting terminal is small, the signal is largely amplified to increase an output level of the preamplifier, thereby preventing a decrease in S/N ratio during transmission of the signal through the cable line.

The variable gain main amplifier incorporated in the measuring equipment body has amplitude characteristics to be corrected and expanded to those of the variable gain preamplifier. Therefore, the signal to be measured having a signal level compressed by the variable gain preamplifier is returned to an original signal level. A dynamic range as the whole equipment is widened. The signal to be measured having a level returned to the original signal level is correctly signal-analyzed by the analyzer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention, in which

FIG. 4 is a perspective view showing of the high frequency signal measuring equipment in FIG. 3;

FIG. 5 is a circuit diagram showing a connecting arrangement of a variable gain preamplifier in FIG. 3;

FIGS. 6 and 7 are graphs for explaining gain and input/output characteristics of the variable gain preamplifier in FIG. 5;

FIGS. 8A and 8B are circuit diagrams showing a connecting arrangement of the variable gain main amplifier in FIG. 3;

DETAILED DESCRIPTION OF THE PREFERRED EMBODIMENTS

Figure 1:
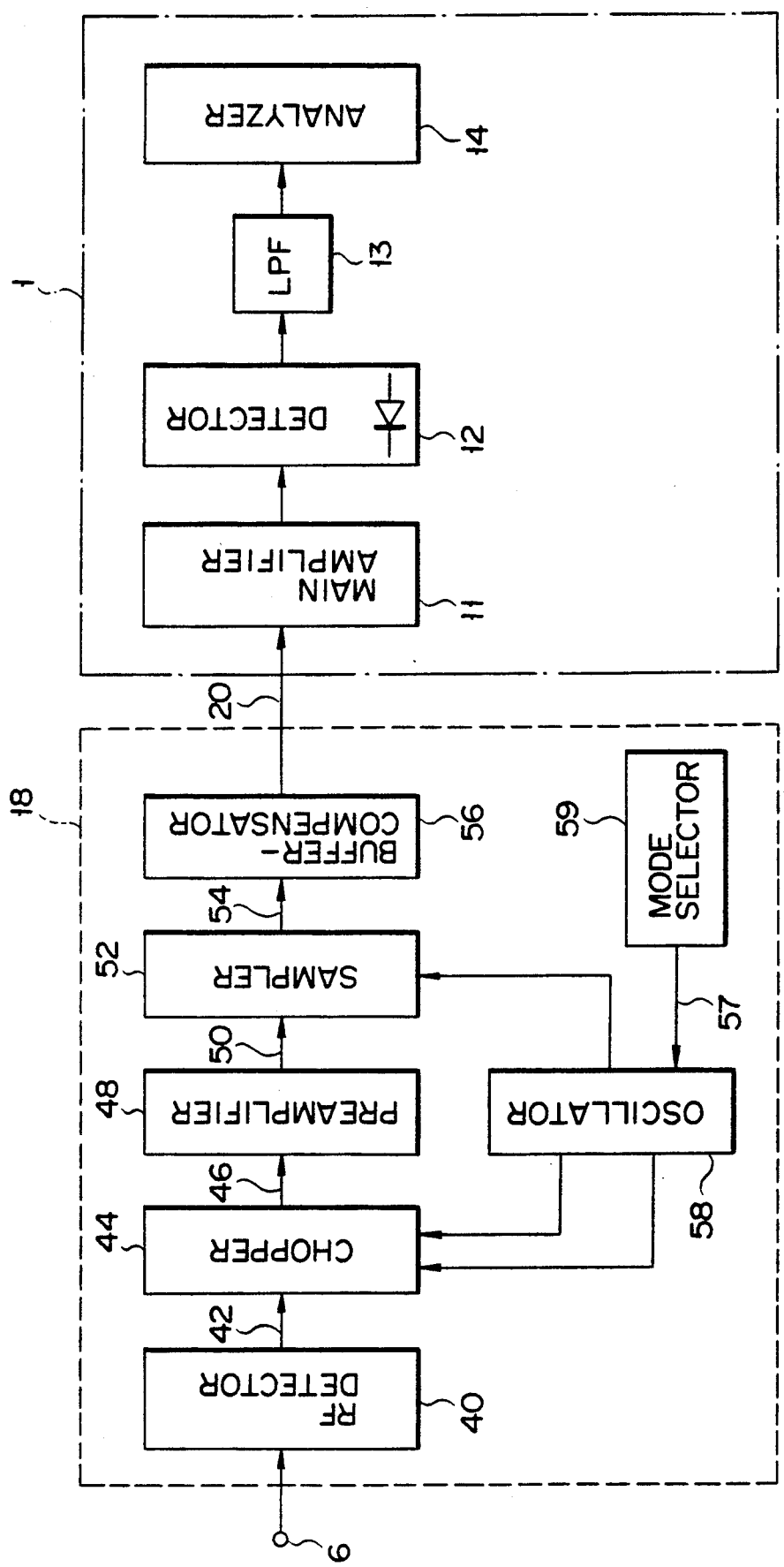
FIG. 1 is a block diagram for explaining an arrangement of a conventional scalar network analyzer.

Reference will now be made in detail to the presently preferred embodiments of the invention as illustrated in the accompanying drawings, in which like reference characters designate like or corresponding parts throughout the several drawings.

An embodiment of the present invention will be described below with reference to the accompanying drawings.

Figure 3:
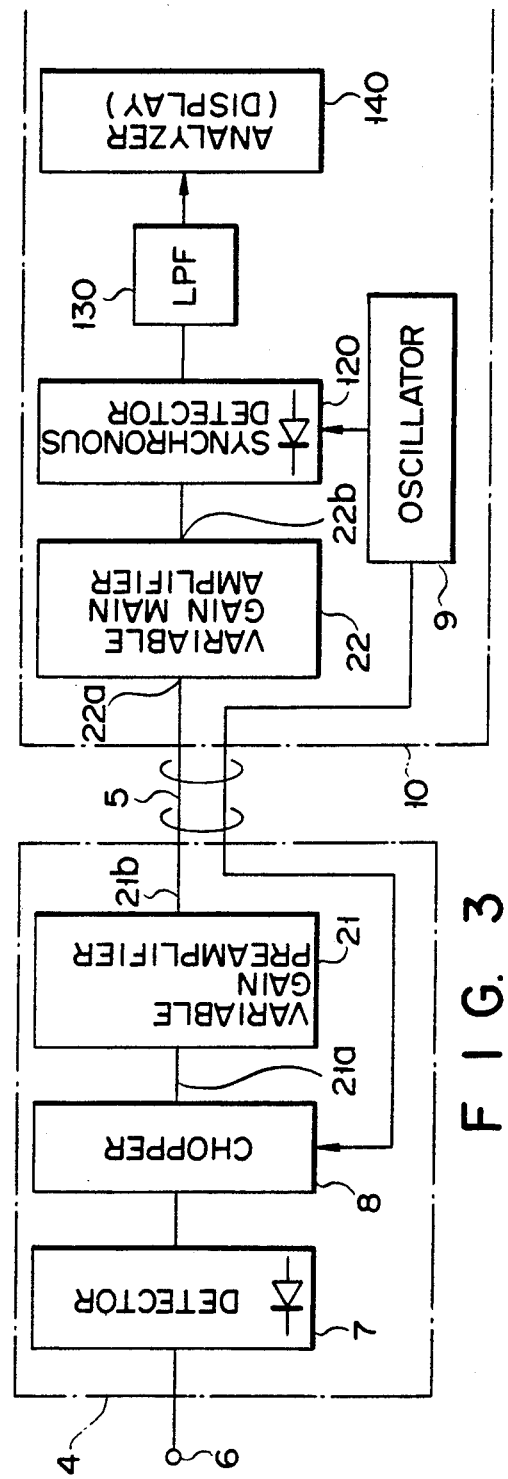
FIG. 3 is a block diagram for explaining an arrangement of a high frequency signal measuring equipment according to an embodiment of the present invention.

FIG. 3 is a block diagram showing a schematic arrangement of a high frequency signal measuring equipment according to the embodiment of the present invention. FIG. 4 is a perspective view showing the whole measuring equipment.

In a measuring equipment for performing signal analysis for signal level characteristics and the like of a signal to be measured at a predetermined measurement point in order to measure electric characteristics of an electric circuit or part of a various types of electric apparatus, as shown in FIG. 4, a connector 3 is arranged on an operation panel 2 arranged on the front surface of a measuring equipment body 10. A signal detector 4 called a probe is detachably connected to the connector 3 through a cable line 5 having, e.g., a length of 1 to 2 m. A signal detecting terminal or connector 6 for inputting a signal is provided at the distal end of the signal detector 4.

As described above, since the signal detector 4 is separated from the measuring equipment body 10 by the cable line 5, an operator can extract a signal at an arbitrary point in a complicate electric circuit or part through the signal detecting terminal or connector 6.

FIG. 3 is a block diagram showing a schematic arrangement of the above high frequency signal measuring equipment. Note that FIG. 3 shows a measuring equipment for measuring signal level characteristics of a high frequency signal having a frequency component of, e.g., 0.01 to 32 GHz. A high frequency signal as a signal to be measured input from the signal detecting terminal or connector 6 is temporarily converted into a DC signal having a signal level corresponding to the amplitude of the signal to be measured The signal to be measured converted into the DC signal is converted into a pulse signal having a predetermined frequency of, e.g., 27 kHz by a chopper 8. That is, the signal level of the signal to be measured input from the signal detecting terminal or connector 6 is converted into an amplitude of each pulse. Note that the sampling signal having a frequency of 27 kHz is supplied from an oscillator 9 arranged in the measuring equipment body 10 through the cable line 5. The pulse signal output from the chopper 8 is amplified by a variable gain preamplifier 21 (to be described later), and then the pulse signal is supplied to the measuring equipment body 10 through the cable line 5.

In summary, a signal to be measured constituted by a high frequency signal having a frequency component of, e.g., 0.01 to 32 GHz input from the signal detecting terminal or connector 6 is converted into a DC signal having a signal level corresponding to the amplitude at a detector 7 and converted into an AC signal having a constant frequency of, e.g., 27 kHz at the chopper 8. The 27-kHz sampling signal is supplied from the oscillator 9 arranged in the measuring equipment body 10 through the cable line 5. The AC signal output from the chopper 8 is amplified by the variable gain preamplifier 21 and supplied to the measuring equipment body 10 through the cable line 5.

Figure 15:
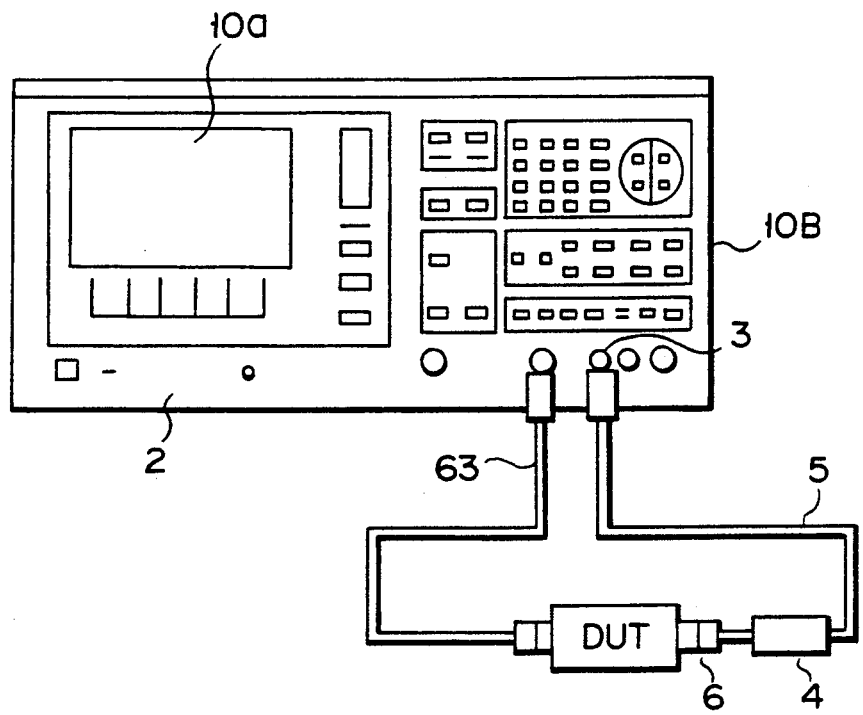
FIG. 15 is a view showing connections of the high frequency signal measuring equipment according to the present invention.
Figure 16:
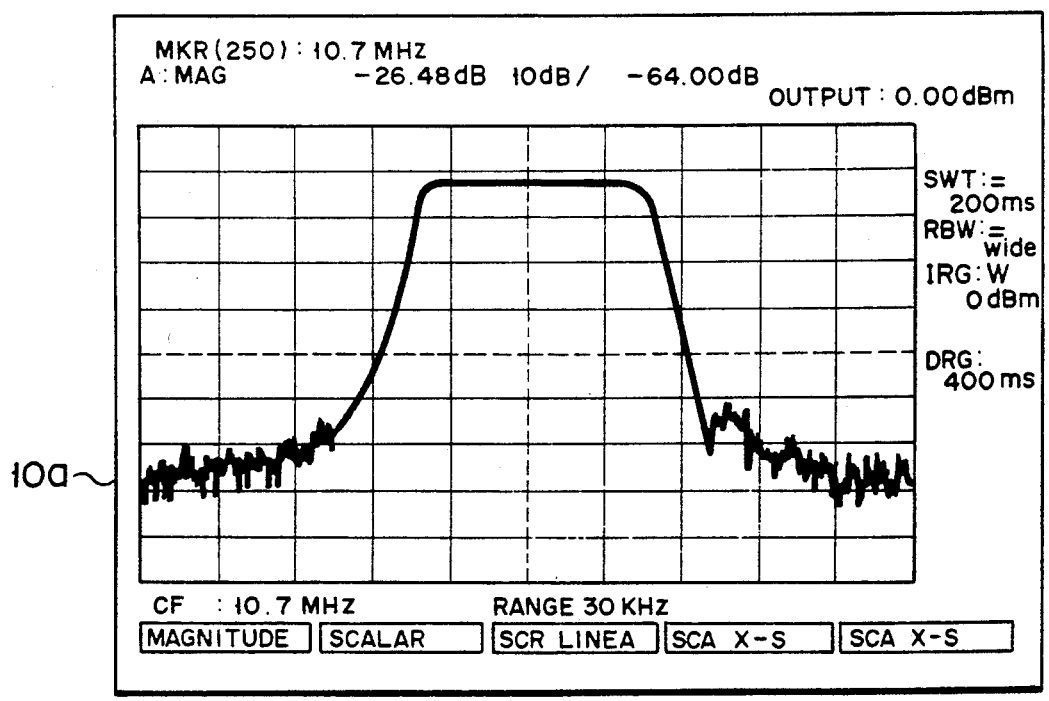
FIG. 16 is a view showing a display according to the present invention.

The signal to be measured converted into the AC signal input to the measuring equipment body 10 is amplified by a variable main amplifier 22 and synchronously detected by the 27-kHz sampling signal output from the oscillator 9 by a detector 120 and is converted into a DC signal again. The signal to be measured converted into the DC signal is input through a low-pass filter 130 to an analyzer 140 including a display. The analyzer 140 performs a predetermined analyzing process to the input DC signal to be measured, and the analysis result is displayed on, e.g., a display screen 10a of the operation panel (FIGS. 15 and 16).

FIG. 5 shows a circuit diagram showing the variable gain preamplifier 21. An input terminal 21a to which the AC signal output from the chopper 8 is applied is connected to the noninverting (+) input terminal of a differential amplifier 23, and the inverting (−) input terminal of the differential amplifier 23 is grounded through a variable resistor 24a and a resistor 24b. Note that the resistances R1 and R2 of the resistors 24a and 24b are set at, e.g., 1 kΩ and 800Ω, respectively.

A first feedback resistor 25 (resistance R3 = 15 kΩ) is connected between the inverting (−) input terminal and a output terminal 21b of the differential amplifier 23, and a series circuit constituted by a pair of parallel-connected, reverse-biased diodes 26a and 26b and a second feedback resistor 27 (resistance R4 = 4.64 kΩ) is connected between the inverting (−) input terminal of the differential amplifier 23 and the output terminal 21b.

In the variable gain preamplifier 21 with the above arrangement, when a signal level $V_I$ of an input signal applied to the input terminal 21a is less than a level $V_P$ of 0.6V defined by a voltage value as a dropped voltage during the ON time of the diodes 26a and 26b, a feedback current is not supplied to the second feedback resistor 27. Therefore, a gain G of the variable gain preamplifier 21 is defined by the resistances (R1 + R2) and R3 of the ground resistors 24a and 24b and the first feedback resistor 25. Note that the gain G can be adjusted by the variable resistor 24a.

When the signal level $V_I$ of the input signal applied to the input terminal 21a is higher than the defined level $V_P$, the feedback current is also supplied to the second feedback resistor 27. Therefore, at this time, a gain GL1 of the variable gain preamplifier 21 is defined by the resistances (R1 + R2), R3, and R4 of the ground resistors 24a and 24b and the first and second feedback resistors 25 and 27.

Figure 2:
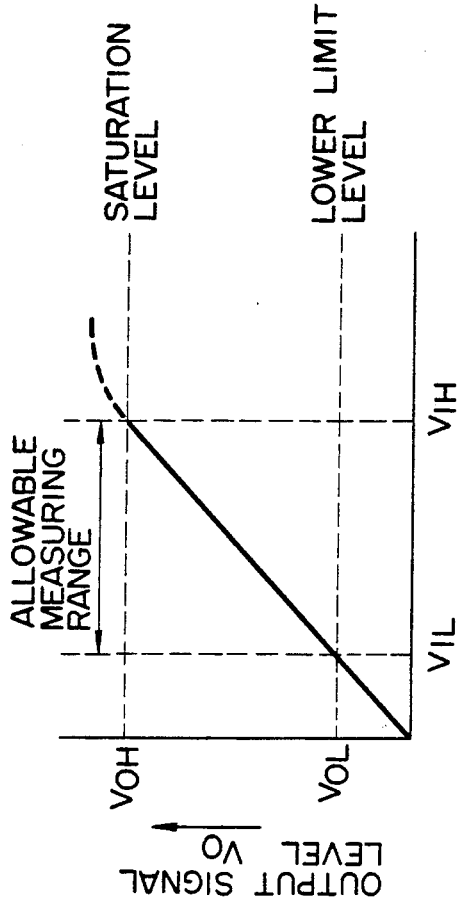
FIG. 2 is a graph showing input/output characteristics of a linear preamplifier used in the AC/DC detection.

That is, as shown in FIG. 6, when the signal level $V_I$ of the input signal is lower than the defined level $V_P$, a feedback current is small, thereby obtaining a high gain $G_H$. When the $V_I$ is higher than the defined level $V_P$, the feedback current is increased, thereby obtaining a low gain $G_L$. Therefore, an amplitude characteristic curve representing a relationship between the input signal level $V_I$ at the input terminal 21a and an output signal level $V_O$ at the output terminal 21b is a nonlinear characteristic curve indicated by a solid curve in FIG. 7. The input signal level $V_I$ is amplified with a gain GH1 in the region where the input level $V_I$ is low, and the input signal level $V_I$ is amplified with a gain GL1 in the region where the input signal level $V_I$ is high. Note that characteristic curve indicated by a broken line in FIG. 7 is an amplitude characteristic curve of the conventional linear preamplifier 48 shown in FIG. 2.

Thus, assuming that a saturation level $V_{OH}$ and a lower limit level $V_{OL}$ of the output signal level $V_O$ of the preamplifier 21 are equal to those of the conventional preamplifier 48, a minimum value $V_{IL}$, of the input signal level $V_I$ is smaller than the $V_{IL}$ of the conventional preamplifier 48. Even if an input signal of a signal level lower than a level corresponding to the minimum value of the conventional preamplifier 48 is input, the output signal level $V_O$ is not lower than the lower level $V_{OL}$. Therefore, it is prevented that an S/N ratio of the signal to be measured output to the measuring equipment body 1 is decreased by mixing of external noise during transmission of the signal through the cable line 5. As a result, an allowable measuring range of the signal to be measured is widened by about 10 dB in the high frequency signal measuring equipment, as a whole compared with that of the conventional equipment, thereby improving a dynamic range and measuring precision.

FIGS. 8A and 8B are circuit diagrams showing the variable gain main amplifier 22 incorporated in the measuring equipment body 10. The variable gain main amplifier 22 comprises a plurality of amplifiers 28a, 28b, 28c, . . . , as shown in FIG. 8A, which are connected in series with each other and which are constituted by a kind of log amplifiers and a pair of inverting adders 42 and 43 for adding output voltages from the amplifiers 28a, 28b, 28c, . . . , as shown in FIG. 8B. Note that the eight amplifiers are used in this embodiment.

The input terminal 22a to which a signal to be measured input through the cable line 5 is supplied is connected to the noninverting (+) input terminal of a differential amplifier 30 in the amplifier 28a through a resistor 29 and is grounded through a pair of parallel-connected, reverse-biased diodes 31a and 31b. A feedback resistor 32 and diodes 33a and 33b are connected between the inverting (−) input terminal and the output terminal of the differential amplifier 30. In addition, a resistor 34 is connected between the inverting (−) input terminal of the amplifier 30 and ground, and a coupling capacitor 35 connected to the second amplifier 28b is connected to the output terminal of the differential amplifier 30.

In the amplifier 28a with the above arrangement, since the input terminal 22a is grounded through the resistor 29 and the diodes 31a and 31b, a signal voltage supplied to the noninverting (+) input terminal of the differential amplifier 30. Therefore, a voltage higher than the above defined voltage $V_P$ (=0.6V) of the diodes 31a and 31b is not applied to the noninverting (+) input terminal of the differential amplifier 30. In addition, when an input signal to the noninverting (+) input terminal has a level higher than a predetermined level, the diodes 33a and 33b are turned on, thereby decreasing the gain. A relationship between an input signal level at the input terminal 22a and an output signal level at the output terminal of the differential amplifier 30 is represented by a characteristic curve A in FIG. 9. According to this, when the output signal level is higher than a predetermined level $V_S$ defined by the diodes 31a and 31b, the output signal level is saturated at a voltage $V_A$. The slope of the amplitude characteristic curve Aa until reaching the predetermined level $V_S$ is defined by resistances of the resistors 32 and 34.

Figure 9:
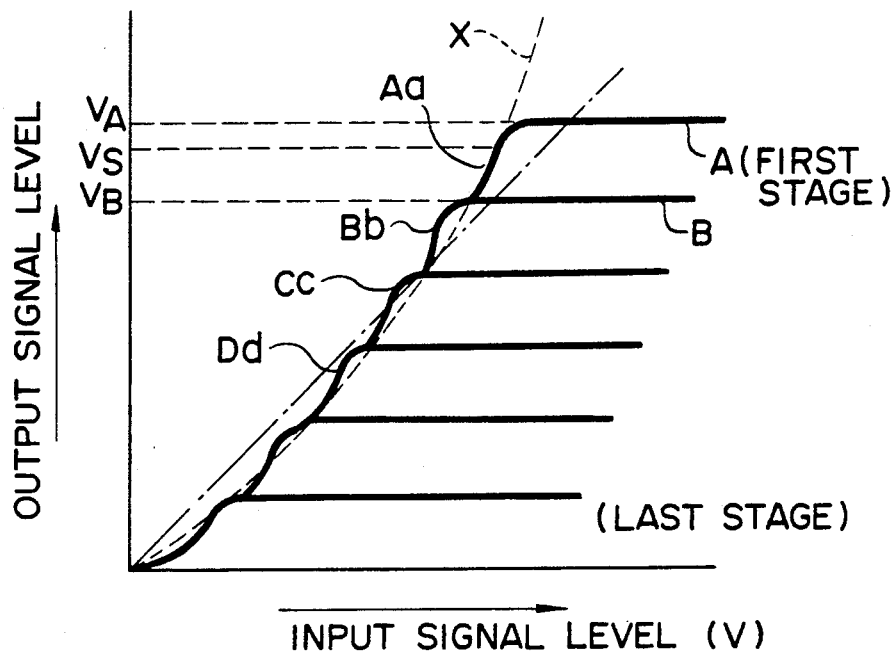
FIG. 9 is a graph showing input/output characteristics of the variable gain main amplifier in FIG. 8.

Since the amplifiers 28b, 28c, . . . of the variable gain main amplifier 22 have the same operation as that of the amplifier 28a, the whole main amplifier 22 is a circuit in which saturation voltages of the first stage (input stage) to the last stage are sequentially decreased depending on an increase in input signal level. As shown in FIG. 8B, output signals from terminals 221, 222, 223, 224, . . . of the stages are added to each other by the inverting adders 42 and 43, thereby obtaining an output signal obtained by log-amplifying the input signal. As shown in FIG. 9, a sum amplitude characteristic curve X at this time is set amplitude characteristics which can be corrected and expanded to the amplitude characteristics of the variable gain preamplifier 21, and the input signal compressed by the variable gain preamplifier 21 can be obtained as an output having log characteristics corresponding to the original level.

Thus, the output signal level of the whole variable gain main amplifier 22 as a function of the input signal level, i.e., an amplitude characteristic curve is defined by the resistances of the resistors 32, 34, 32b, 34b, . . . of the amplifiers 28a, 28b, . . . and a resistance defining the gains of the inverting adders 42 and 43. The slope of a sum characteristic curve is increased toward the previous stages, and the amplitude characteristic curve X indicated by the broken line in FIG. 9 can be finally obtained. That is, when an input signal level is low, an output signal level is amplified to have a low level. When the output signal level is high, the output signal level is amplified to have a high level.

Thus, the amplitude characteristic curve X of the variable gain main amplifier 22 constituted by the log amplifiers is set to be corrected and expanded to the amplitude characteristic curve of the variable gain preamplifier 21, and the input signal level compressed by the variable gain preamplifier 21 can be returned to the original level. Therefore, the analyzer 140 can perform an analyzing process for the signal to be measured returned to the original input signal level.

As described above, the dynamic range of the high frequency measuring equipment can be widened as a whole, and an S/N ratio and measuring precision can be improved.

Figure 10:
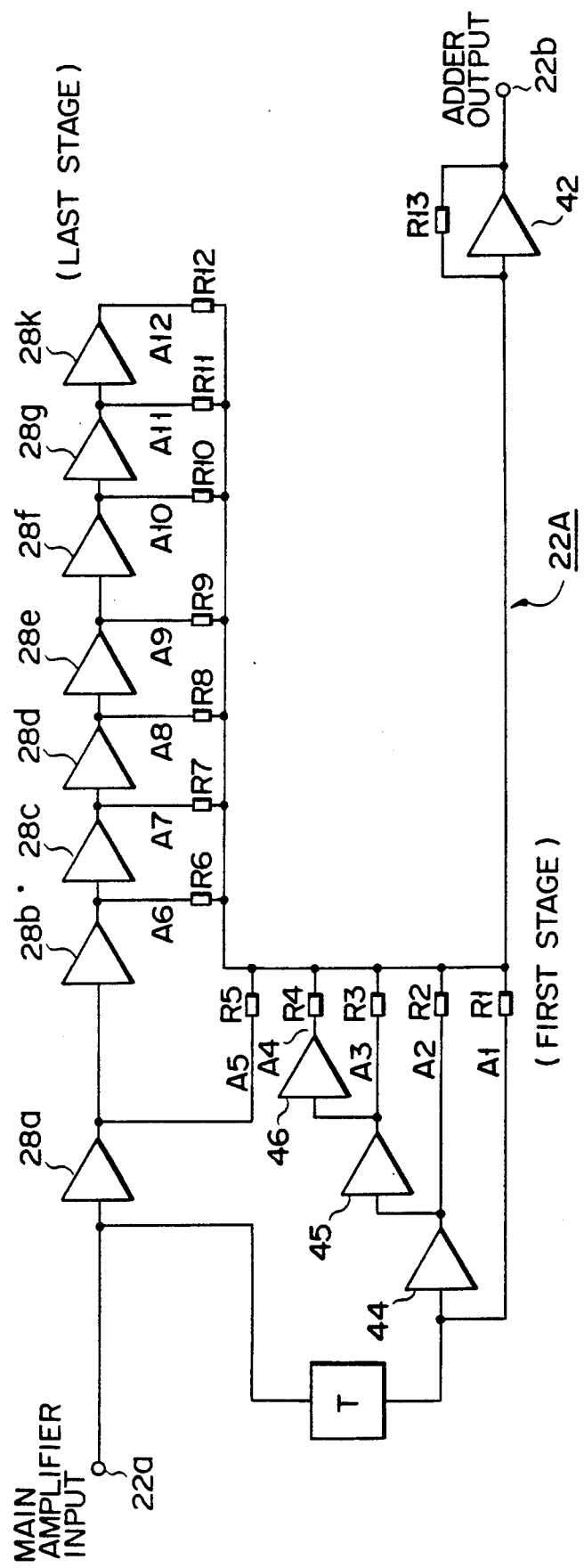
FIG. 10 is a block diagram showing another connecting arrangement of a variable gain main amplifier in FIG. 3.

FIG. 10 is a block diagram showing a variable gain main amplifier 22A installed in a measuring equipment body 1 according to another embodiment of the present invention. The variable gain main amplifier 22A is arranged as a kind of log amplifier and comprises a plurality of amplifiers 44 to 46 and 28a to 28k connected in series with each other and an adder 42 for adding output voltages A1 to A12 of the amplifiers 44 to 46 and 28a to 28k. Each of the amplifiers 28a to 28k and 44 to 46 is to be saturated at a predetermined level, and the amplifiers 28h, 28g, . . . 28a, 46, 45 and 44 are sequentially saturated from the last stage depending on an increase in input level.

When a signal to be measured having a low level of, e.g., about −60 dBm is input from a signal detecting terminal or connector 6 through a cable line 5, the input signal is sequentially amplified by the amplifiers 44 to 46 and 28a to 28h, thereby obtaining an output A12 from the last amplifier 28h.

At this time, each of the amplifiers 44 to 46 and 28a to 28h has an output level corresponding to the input level although it is very low.

When an signal to be measured having a high level of, e.g., 0 dBm or more is input, the amplifiers 44 to 46 and 28a to 28h are sequentially saturated from the last amplifier 28h, thereby obtaining an output voltage A1 is output from the first stage finally. All the amplifiers 44 to 46 and 28a to 28h are saturated at an upper limit value $V_{IH}$ of the input level. The outputs from the amplifiers are added to each other by the amplifier 42 and output to an output terminal 22b of the main amplifier 22A. The output signals A1 to A12 of the stages are added to obtain an output signal obtained by logarithmically amplifying an input signal from the variable gain main amplifier 22A. A sum gain X at this time is adjusted to correct a nonlinear amplitude characteristic curve of a variable gain preamplifier 21 to obtain a linear output, and an output having better linearity, as shown in FIG. 11, than that in a dynamic range of an input signal level applied to an input terminal 6 and compressed by the variable gain preamplifier 21.

Therefore, a relationship between an input signal level and an output signal level of the variable gain main amplifier 22A as a whole, i.e., an amplitude characteristic is defined by resistances R1 to R13 defining gains of the amplifiers 44 to 46 and 28a to 28h and the adder 42.

Figure 11:
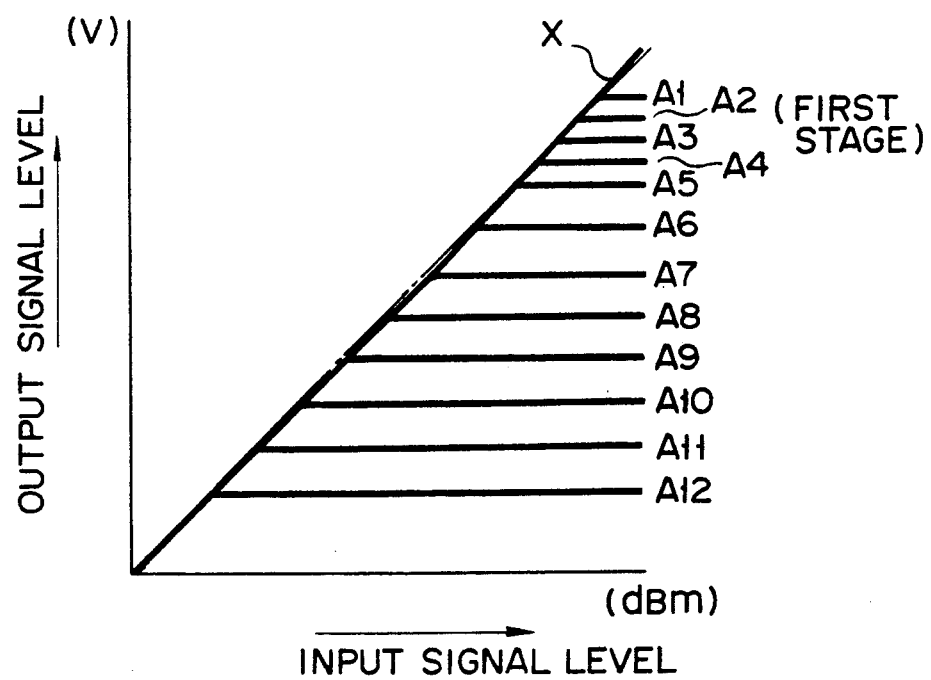
FIG. 11 is a graph showing whole input/output characteristics of the variable gain preamplifier and main amplifier in FIG. 3.

At the same time, the variable gain main amplifier 22A adjusts the gains of outputs A1 to A12 during addition to expand and correct a signal having compressing characteristics and output from the variable gain preamplifier 21, thereby finally obtaining an amplitude characteristic curve X indicated by a solid curve in FIG. 11.

When the input level is low, the signal compressed by the variable gain amplifier 21 has a level higher than that of the prior art. Therefore, the signal has a good resistance against noise transmitted through the cable line, and an S/N ratio is increased, thereby obtaining a highly sensitive equipment.

In addition, since the input signal compressed by the variable gain preamplifier 21 is precisely expanded and corrected by the variable gain main amplifier 22, an analyzer 14 can perform an analyzing process corresponding to a dynamic range of the input signal.

Figure 12:
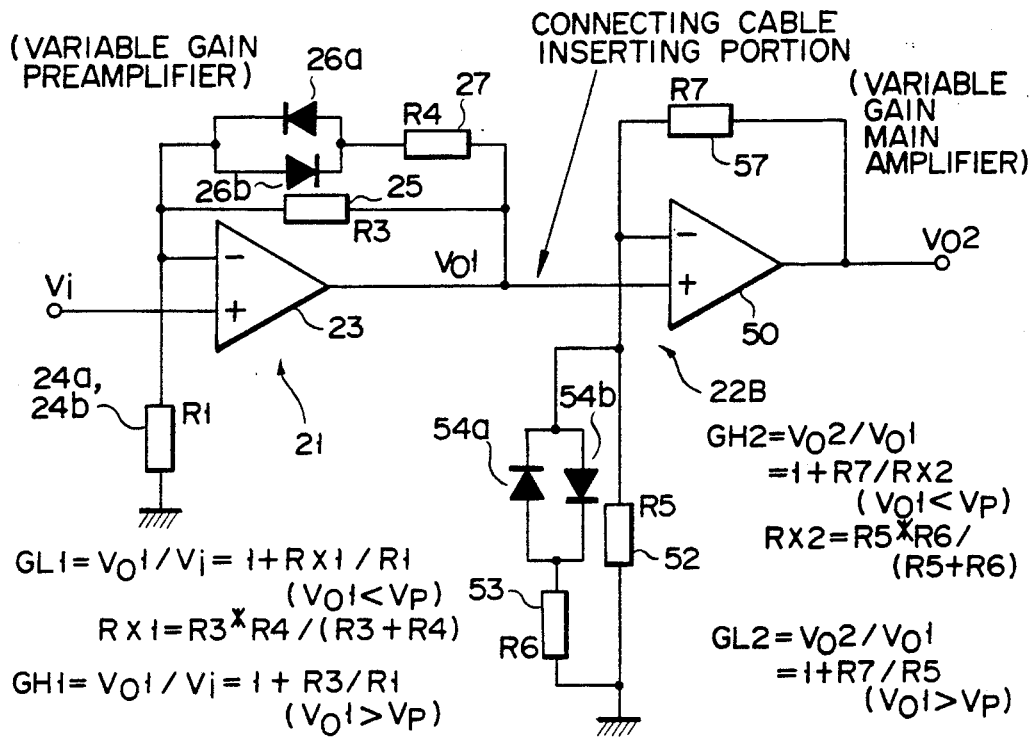
FIG. 12 is a diagram showing a main part of another embodiment of the present invention.

FIG. 12 shows still another embodiment. In the above-described embodiments, the variable gain main amplifiers 22 and 22A function as log amplifiers. However, in this embodiment, linearity can be obtained by using a variable gain preamplifier 21 and a variable gain main amplifier 22B as a whole.

Figure 13:
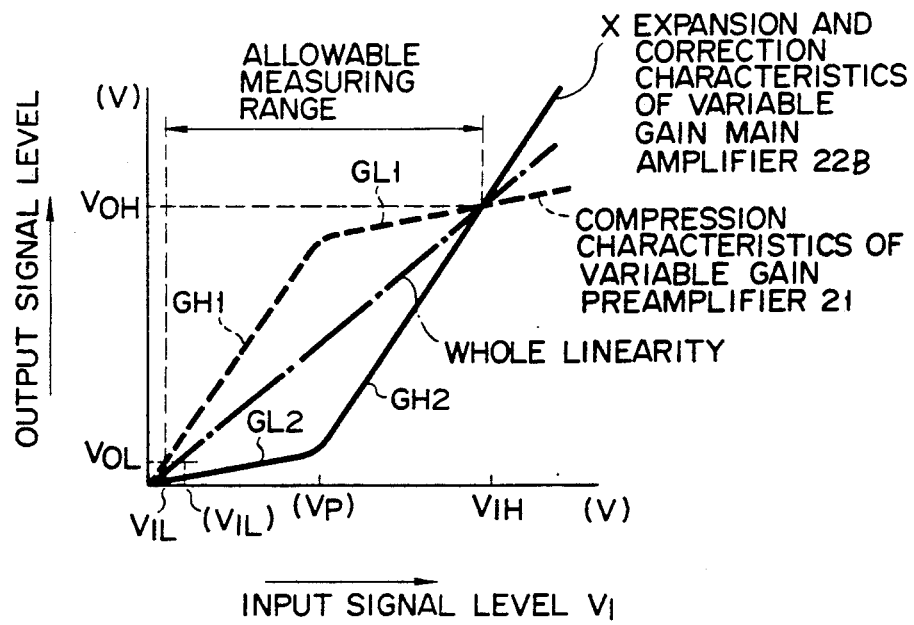
FIG. 13 is a graph showing input/output characteristics and whole linear gains of a variable gain preamplifier and a variable gain main amplifier used in the embodiment in FIG. 12.

That is, in FIG. 12, the variable gain preamplifier 21 is identical to that shown in FIG. 5 and has a high gain OH1 indicated by a broken curve in FIG. 13 in a range where its level is lower than the level VP and has a low gain GL1 in a range where its level is higher than the level LP indicated by a broken curve in FIG. 13. By using an amplifier 50, resistors 51, 52, and 53, and diodes 54a and 54b, the variable gain main amplifier 22B has a low gain GL2 indicated by a solid line in FIG. 13 in a range where its level is lower than the level VP and has a high gain GH2 in a range where its level is higher than the level LP indicated by a solid curve in FIG. 13.

Thus, the amplitude characteristic curves of the variable gain preamplifier 21 and the variable gain main amplifier 22B are compensated for each other to obtain linear amplification having linearity as a whole, as indicated by the alternate long and short dashed line.

In this case, in order to perform the linear amplification, a constant $Vo2 = K*Vi$ (K: gain is constant) must be established.

Using symbols in FIG. 13, the constants are selected so that the following gains K are equalized, thereby obtaining a constant gain (linear amplification):

$K = GL1*GH2$ (for Vol > $V_P$)

$K = GH1*GL2$ (for Vol < $V_P$)

Figure 14:
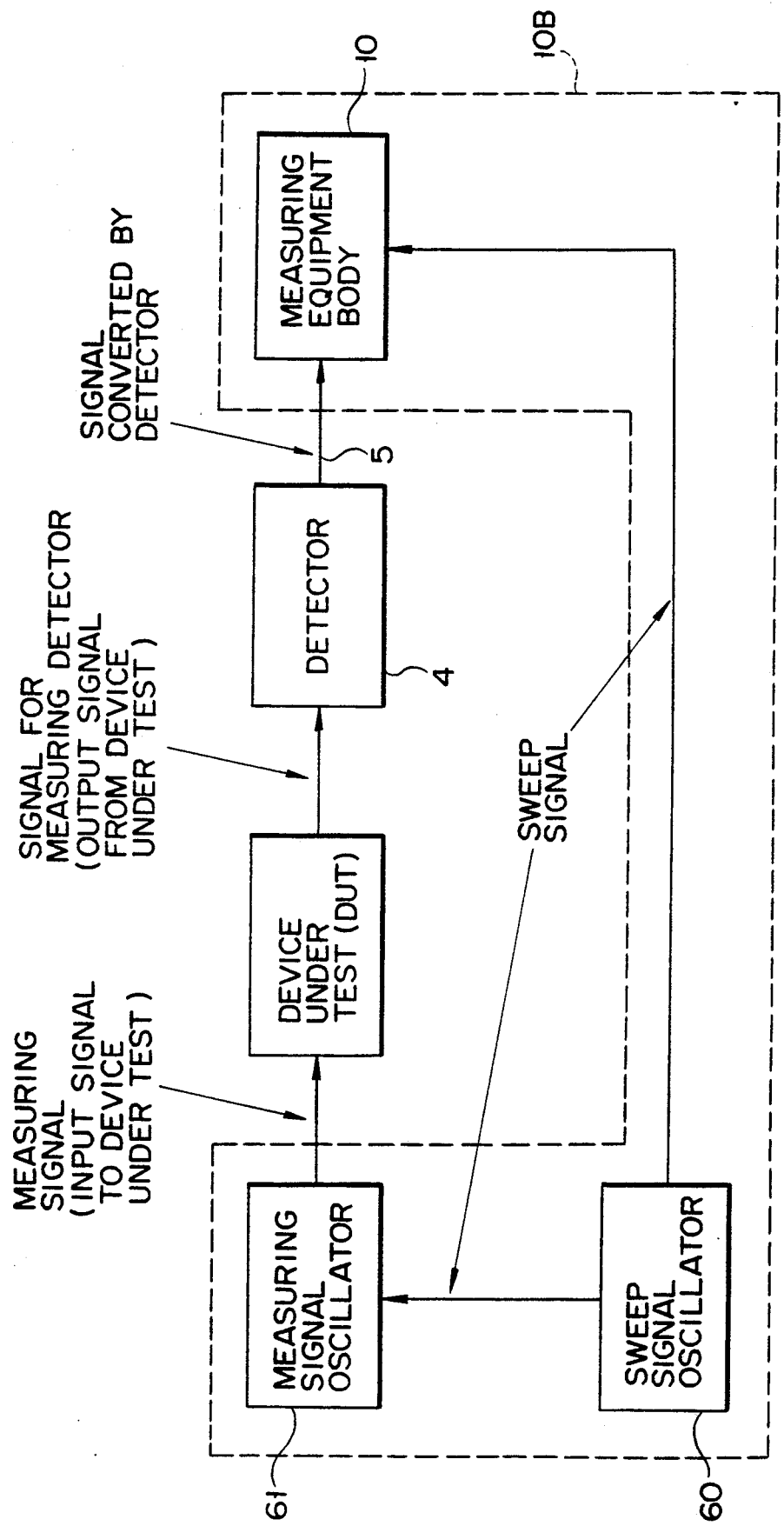
FIG. 14 is a block diagram showing a scalar network analyzer to which a high frequency signal measuring equipment according to the present invention is applied.

FIG. 14 shows an arrangement wherein a high frequency signal measuring equipment according to the present invention is applied to a scalar network analyzer for measuring frequency characteristics of a device to be measured (e.g., band-pass filter) (DUT).

In this embodiment, a measuring equipment body 10B comprises elements included in the measuring equipment body 10 shown in FIG. 3, a sweep signal generator 60, and a measuring signal generator 61. The measuring equipment body 10B is connected to the DUT (device under test) through a cable line 5, a detector 4, and a connector 6. The measuring signal generator 61 supplies a measuring signal which has a frequency changed in accordance with a sweep signal to the device under test (DUT) via a cable 63. The sweep signal is supplied to the measuring signal generator 61 and supplies frequency data to the measuring equipment body 10. The DUT amplifies (losses) a signal level in accordance with a signal frequency from the measuring signal generator 61 and outputs it. The output signal level is changed in accordance with frequency characteristics of the DUT. The detector 4 detects, modulates, and amplifies a high frequency signal from the DUT and supplies it to the measuring body 10 as a signal corresponding to the high frequency signal The measuring equipment body 10 detects (analyzes) a signal (changed in accordance with the frequency characteristics of the device under test) supplied from the detector 4 and causes a display section 10a (e.g., a cathode-ray tube) to display the signal (FIG. 16). In this case, the sweep signal supplied from the sweep signal generator 60 is used as an axis of a frequency during displaying.

Note that, in the above description, analytic contents in the measuring equipment body 10 are as follows:

In a network analyzer, (i) amplitude-frequency characteristics using a frequency plotted along the absissa and a gain (loss) of the DUT plotted along the ordinate, (ii) extraction of features of transfer function of the device under test, for example, measuring an absissa value (value of gain or loss) and an ordinate value (frequency) of the maximum or/and minimum value of the amplitude-frequency characteristics, calculating a ripple value, and the like; and in a level measuring device, (i) time characteristics of an input level.

As has been describe above, according to a high frequency signal measuring equipment according to the present invention, a variable gain preamplifier having a gain decreased in accordance with an increase in input signal level on a cable detector side and a variable gain amplifier for correcting a gain on the variable gain preamplifier side so that the gain is increased in accordance with an increase in input signal level are used. A low input signal can be amplified to have a large amplitude by the variable gain preamplifier, and a high input signal can be amplified to have a small amplitude. Therefore, an allowable lower limit level for contributing to prevention of a decrease in S/N ratio due to mixing of noise during transmission of the signal through the cable line is lowered, and the minimum value of the input signal level can be decreased. As a result, an allowable range of the input signal level at the preamplifier on the cabled detector side can be largely widened, and an allowable measuring range of a signal to be measured in the whole measuring equipment can be largely widened. A measuring dynamic range can be widened, and measuring precision and sensitivity can be improved.

Additional embodiments of the present invention will be apparent to those skilled in the art from consideration of the specification and practice of the present invention disclosed herein It is intended that the specification and examples be considered as exemplary only, with the true scope of the present invention being indicated by the following claims.

What is claimed is:

1. A high frequency signal measuring apparatus comprising:
    a signal detector, including:
        signal inputting means for inputting a high frequency signal to be measured;
        detecting means for detecting said high frequency signal to be measured and which is input by said signal inputting means, said detecting means generating a detecting output signal; and
        converting means for amplifying said detecting output signal from said detecting means, said converting means including a variable gain preamplifier which generates a variable gain output signal having a first gain higher than a linear gain when said detecting output signal is smaller than a predetermined value and a second gain lower than the linear gain when said detecting output signal is larger than the predetermined value;
    a cable line for transmitting said variable gain output signal from said variable gain preamplifier; and
    a measuring apparatus body comprising:
        decoding means for amplifying said variable gain output signal from said variable gain preamplifier transmitted by said cable line, said decoding means including a variable gain main amplifier having a first gain lower than a linear gain when said variable gain output signal from said variable gain preamplifier is smaller than a predetermined value and a second gain higher than the linear gain when said variable gain output signal from said variable gain preamplifier is larger than the predetermined value, said variable gain main amplifier including means for correcting amplitude characteristics of said variable gain output signal of said variable gain preamplifier to obtain a main amplifier output signal having log linear characteristics; and
        analyzing means included in said measuring apparatus body for performing a predetermined signal analysis of said main amplifier output signal of said variable gain main amplifier.

2. An apparatus according to claim 1, wherein said analyzing means of said measuring apparatus body includes:
    an analyzer for performing said predetermined signal analysis; and
    a display for displaying an output from said analyzer.

3. A high frequency signal measuring apparatus comprising:
    a signal detector including:
        signal inputting means for inputting a high frequency signal to be measured;
        detecting means for detecting said high frequency signal to be measured and which is input by said signal inputting means, said detecting means generating a detecting output signal; and
    converter means comprising:
        chopper means for chopping said detecting output signal from said detecting means with a signal having a predetermined frequency, and generating a chopper output signal; and
        converting means for amplifying said chopper output signal, said converting means including a variable gain preamplifier which generates a variable gain output signal having a first gain higher than a linear gain when said chopper output signal is smaller than predetermined value, and a second gain lower than the linear gain when said chopper output signal is larger than the predetermined value;
    a cable line for transmitting said variable gain output signal from said variable gain preamplifier; and
    a measuring apparatus body including decoding means, said decoding means comprising:
        a variable gain main amplifier for amplifying said variable gain output signal from said variable gain preamplifier transmitted through said cable line and having a first gain lower than a linear gain when said variable gain output signal from said variable gain preamplifier is smaller than a predetermined value and a second gain higher than the linear gain when the variable gain output signal from said variable gain preamplifier is larger than the predetermined value, said variable gain main amplifier including means for correcting amplitude characteristics of said variable gain preamplifier of said signal detector to obtain a main amplifier output signal having log linear characteristics; and
        synchronous detecting means for synchronously detecting said main amplifier output signal from said variable gain main amplifier with a signal having a predetermined frequency; and
    analyzing means positioned in said measuring apparatus body for performing a predetermined signal analysis of said main amplifier output signal.

4. An apparatus according to claim 3, wherein said analyzing means of said measuring apparatus body includes:
    an analyzer for performing said predetermined signal analysis; and
    a display for displaying an output from said analyzer.

5. An apparatus according to claim 3, wherein said decoding means of said measuring apparatus body includes:
    means for generating a signal having a predetermined frequency;
    means for supplying said signal having said predetermined frequency to said chopper means of said signal detector through said cable line.

6. An apparatus according to claim 3, wherein said measuring signal generating means of said measuring apparatus body includes a cable for transmitting the measuring signal to said device under test.

7. A network analyzer comprising:
a signal detector including:
signal inputting means for inputting a high frequency signal to be measured from a device under test;
detecting means for detecting said high frequency signal to be measured and which is input by said signal inputting means, said detecting means generating a detecting output signal; and
converting means for amplifying said detecting output signal from said detecting means, said converting means including a variable gain preamplifier which generates a variable gain output signal having a first gain higher than a linear gain when said detecting output signal is smaller than a predetermined value and a second gain lower than the linear gain when said detecting output signal is larger than the predetermined value;
a cable line for transmitting said variable gain output signal from said variable gain preamplifier; and
a measuring apparatus body comprising:
decoding means for amplifying said variable gain output signal from said variable gain preamplifier transmitted from said cable line, said decoding means including a variable gain main amplifier for generating a main amplifier output signal having a first gain lower than a linear gain when said variable gain output signal from said variable gain preamplifier is smaller than a predetermined value and a second gain higher than the linear gain when said variable gain output signal from said variable gain preamplifier is larger than the predetermined value, said variable gain main amplifier including means for correcting amplitude characteristics of said variable gain preamplifier of said signal detector to obtain a main amplifier output signal having log linear characteristics;
analyzing means included in said measuring apparatus body for performing a predetermined signal analysis of said main amplifier output signal of said variable gain main amplifier of said decoding means;
display means for displaying an output from said analyzing means corresponding to a frequency:
measuring signal generating means for generating a measuring signal having a predetermined frequency, said measuring signal generating means including a cable for supplying said measuring signal to said device under test; and
sweep signal generating means for generating a sweep signal having a predetermined voltage and controlling a display operation of said display means and a measuring signal generating operation of said measuring signal generating means.

8. A network analyzer including:
a signal detector comprising:
signal inputting means for inputting a high frequency signal to be measured form a device under test;
detecting means for detecting said high frequency signal to be measured input by said signal input means, said detecting means generating a detecting output signal; and
converter means comprising:
chopper means for chopping said detecting output signal from said detecting means with a signal having a predetermined frequency, said chopper generating a chopper output signal; and
converting means for amplifying said chopper output signal from said chopper means, said converting means including a variable gain preamplifier generating a variable gain output signal having a first gain higher than a linear gain when said chopper output signal is smaller than a predetermined value and a second gain lower than the linear gain when said chopper output signal is larger than the predetermined value;
a cable line for transmitting said variable gain output signal from said variable gain preamplifier of the converting means of said signal detector; and
a measuring apparatus body comprising:
decoding means including:
a variable gain main amplifier for amplifying said variable gain output signal from said variable gain preamplifier transmitted through said cable line, and having a first gain lower than a linear gain when said variable gain output signal from said variable gain preamplifier is smaller than a predetermined value and a second gain higher than the linear gain when said variable gain output signal from said variable gain preamplifier is larger than the predetermined value, said variable gain main amplifier including means for correcting amplitude characteristics of said variable gain output signal generated by said variable gain preamplifier of said signal detector to provide a main amplifier output signal having log linear characteristics;
synchronous detecting means for synchronously detecting said main amplifier output signal from said variable gain main amplifier with a signal having a predetermined frequency; and
generating means for generating a first signal having a predetermined frequency, supplying the first signal to said synchronous detecting means, and supplying the first signal to said chopper means of said signal detector through said cable line;
analyzing means for performing a predetermined signal analysis on said main amplifier output signal of said decoding means;
display means for displaying an output from said analyzing means corresponding to a frequency;
measuring signal generating means for generating a measuring signal having a predetermined frequency and supplying the measuring signal to said device under test; and
sweep signal generating means for generating a sweep signal having a predetermined voltage and controlling a display operation of said display means and a measuring signal generating operation of said measuring signal generating means.

9. The analyzer according to claim 8, wherein said measuring signal generating means of said measuring apparatus body includes a cable for transmitting said measuring signal to said device under test.

* * * * *